United States Patent [19]

Rho et al.

[11] Patent Number: 6,010,926
[45] Date of Patent: *Jan. 4, 2000

[54] METHOD FOR FORMING MULTIPLE OR MODULATED WELLS OF SEMICONDUCTOR DEVICE

[75] Inventors: Kwang Myoung Rho; Chan Kwang Park; Yo Hwan Koh, all of Ichon-shi, Rep. of Korea

[73] Assignee: Hyundai Electronics Industries Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,872

[22] Filed: Dec. 22, 1997

[30] Foreign Application Priority Data

Dec. 30, 1996 [KR] Rep. of Korea ...................... 96-76307

[51] Int. Cl.⁷ ............................................... H01L 21/8238
[52] U.S. Cl. .......................... 438/199; 438/208; 438/224; 438/228; 438/232; 438/420; 438/526; 438/529
[58] Field of Search ................................ 438/199, 208, 438/220, 224, 232, 420, 228, 526, 529, FOR 160, FOR 161, FOR 168, FOR 216, FOR 217, FOR 218, FOR 234

[56] References Cited

U.S. PATENT DOCUMENTS

| 5,141,882 | 8/1992 | Komori et al. ............................ 437/34 |
|---|---|---|
| 5,292,671 | 3/1994 | Odanaka ..................................... 437/29 |
| 5,399,895 | 3/1995 | Koga ........................................ 257/372 |
| 5,401,671 | 3/1995 | Komori et al. .............................. 437/27 |
| 5,455,437 | 10/1995 | Komori et al. . |
| 5,478,759 | 12/1995 | Mametani et al. ......................... 437/30 |
| 5,501,993 | 3/1996 | Borland . |
| 5,693,505 | 12/1997 | Kobayashi ............................... 437/154 |
| 5,759,884 | 6/1998 | Youn ....................................... 438/228 |

FOREIGN PATENT DOCUMENTS

| 401095551 | 4/1989 | Japan ..................................... 438/216 |
|---|---|---|
| 404092466 | 3/1992 | Japan ..................................... 438/160 |
| 9-199612 | 7/1997 | Japan . |
| 2314680 | of 0000 | United Kingdom . |

*Primary Examiner*—Wael Fahmy
*Assistant Examiner*—Long Pham
*Attorney, Agent, or Firm*—Blakely Sokoloff Taylor & Zafman

[57] ABSTRACT

The present invention provide a method for forming a triple well. The triple well includes an n-well, a first p-well surrounded with the n-well and a second p-well apart from the first p-well and adjacent to the n-well. According to the present invention, only one conductivity type of impurities are implanted in each well. Therefore, it is possible to prevent the decrease of the carrier mobility and increase of the leakage current.

5 Claims, 7 Drawing Sheets

METHOD FOR FORMING MULTIPLE OR MODULATED WELLS OF SEMICONDUCTOR DEVICE

BACKGROUND OF THE INVENTION

1. Field of the Invention

The present invention relates to a method for forming semiconductor devices and more particularly, to a method for forming a triple well consisting of three ion-implanted regions, each of which contains only one conductivity type of impurities.

2. Description of the Prior Art

In general, the conventional semiconductor devices are formed by the COOS(Complementary MOS) technology. According to the CMOS technology, a PMOS and an NMOS transistors are fabricated on a same wafer. Accordingly, the well formation technique is required to isolate the transistors from one another.

The diffusion process has been used in the well formation technique. According to this diffusion well formation technique, impurities are implanted at a low energy level and the high-temperature process is performed for a long time. Accordingly, the manufacturing cost is increased and it is difficult to control the characteristics of semiconductor devices because the ion concentration is monotonously decreased from the surface of the well to the bottom of the well.

A conventional well formation technique is developed to solve the above mentioned problems. According to the conventional well formation technique, impurities are implanted at a high energy level and a relatively simple thermal treatment is performed. It is possible to prevent the punch through and the latch up phenomena and to improve the characteristics of semiconductor devices.

Figure 1:
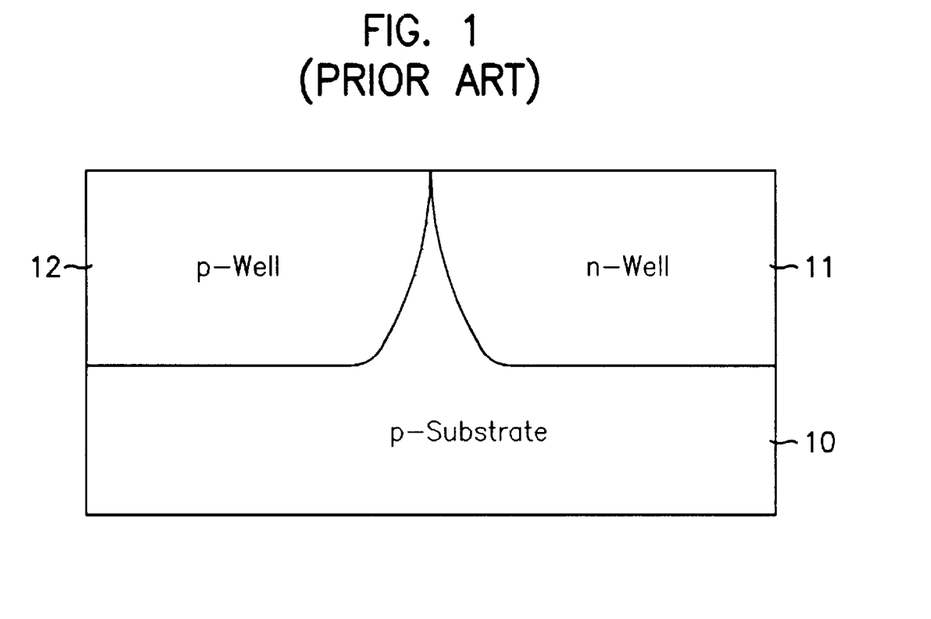
FIG. 1 is a cross sectional view of a twin well structure.
Figure 2:
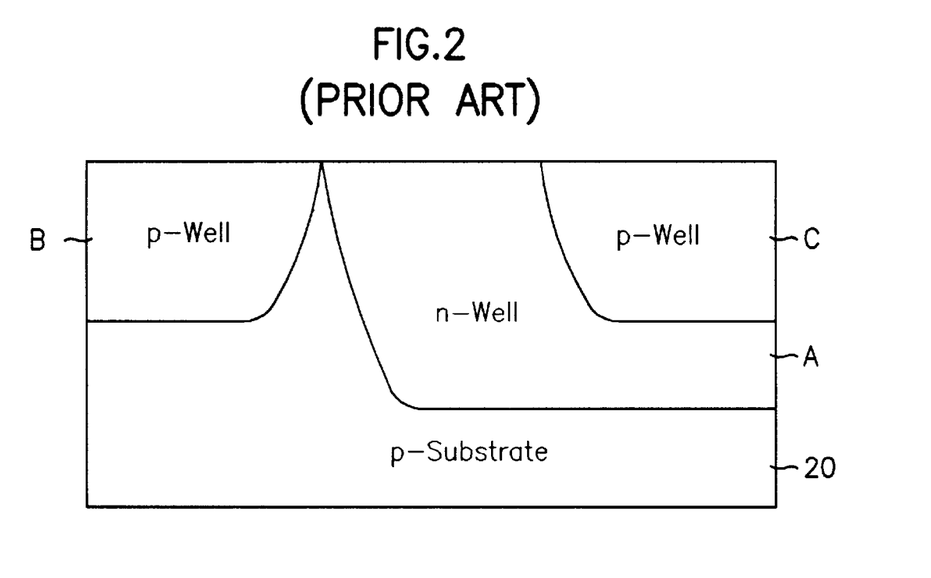
FIG. 2 is a cross sectional view of a triple well structure.

The well structure is classified into twin well and triple well structures on the basis of the number of wells. FIG. 1 and FIG. 2 are schematic views of twin well and triple well structures respectively formed on the semiconductor substrate 10 and 20. The twin well includes an n-well 11 and a p-well 12. The triple well, shown in FIG. 2, is formed on the p-type semiconductor substrate 20 and it includes an n-well A, a first p-well B and a second p-well C. The first p-well B is apart, by a predetermined distance, from a second p-well C and is adjacent to the n-well A. The second p-well C is surrounded by the n-well A. The conductivity types of respective wells may be changed into the opposite types when the triple well is formed on the n-type semiconductor substrate.

In comparison with the twin well structure, the triple well structure has an advantage in that it is possible to differently control the characteristics of an NMOS transistor formed on the first p-well B and an NMOS transistor formed on the second p-well C. The triple well structure also has another advantage that the second p-well C has the sufficient voltage to withstand the noise because the well junction capacitance between the second p-well C and the n-well A is relatively large.

The conventional method for forming a triple well is shown in FIGS. 3A to 3D.

Figure 3A:
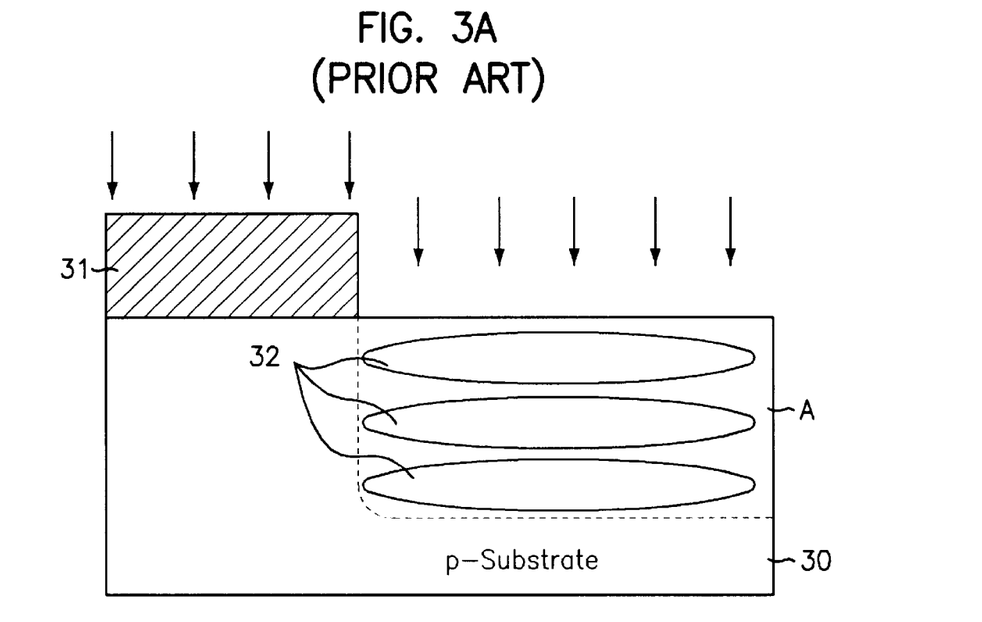
FIGS. 3A to 3D are cross sectional views illustrating a conventional method for forming a triple well of semiconductor device.

First, referring to FIG. 3A, a photoresist pattern 31 is formed on a p-type semiconductor substrate 30. The photoresist pattern 31 exposes two regions, in which an n-well A and a second p-well C are respectively to be formed. The second p-well C is surrounded by the n-well A. After forming the photoresist pattern 31, the implantation processes are carried out by three or four times with different energy to form n-type impurities doped regions 32 in the n-well A and the second p-well C.

Figure 3B:
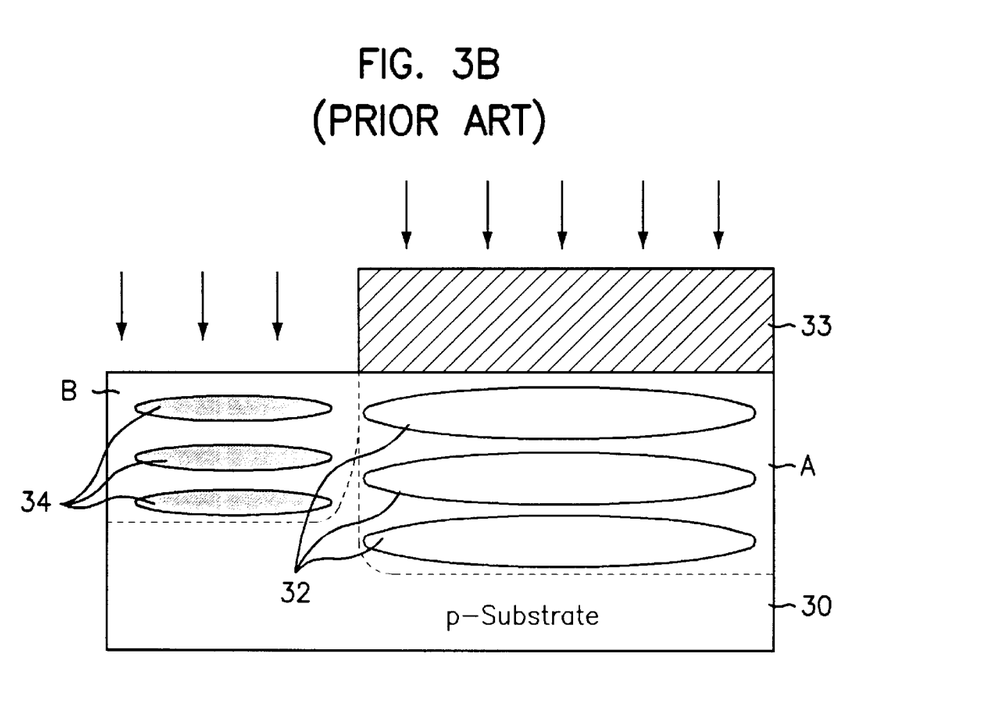

Referring to FIG. 3B, the photoresist pattern 31 is removed and a photoresist pattern 33 is formed. The photoresist pattern 33 exposes a region, in which a first p-well B is to be formed. The first p-well B is apart, by a predetermined distance, from the second p-well C and is adjacent to the n-well A. After forming the photoresist pattern 33, the implantation process are carried out by three or four times with different energy to form p-type impurities doped regions 34 in the first p-well B.

Figure 3C:
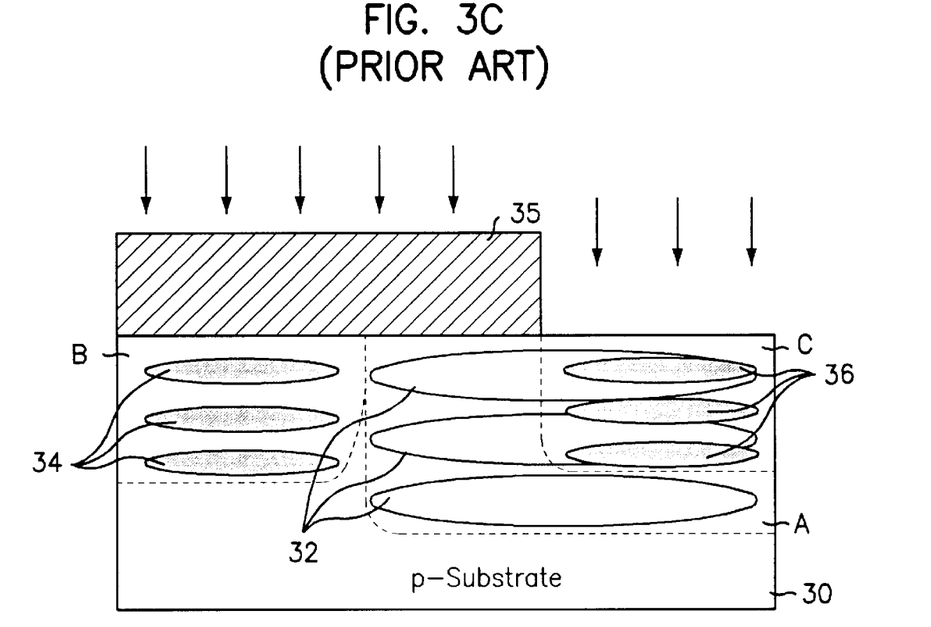

Referring next to FIG. 3C, the photoresist pattern 33 is removed and a photoresist pattern 35 is formed. The photoresist pattern 35 exposes a region, in which the second p-well C, surrounded by the n-well, is to be formed. After forming the photoresist pattern 35, the implantation processes are carried out by three or four times with different energy to form p-type impurities doped regions 36 in the second p-well C.

A portion of n-type impurities doped regions 32 was formed in the second p-well C before the p-type impurities doped regions 36 are formed. Accordingly, the amount of the p-type impurities implanted into the second p-well C should be sufficient to offset the n-type impurities formerly implanted into the second p-well C. Therefore, it is difficult to control the doping profile of the second p-well C. The leakage current increases because the substrate is damaged. The mobility of carriers decreases because two conductivity types of ions exist in one well.

Figure 3D:
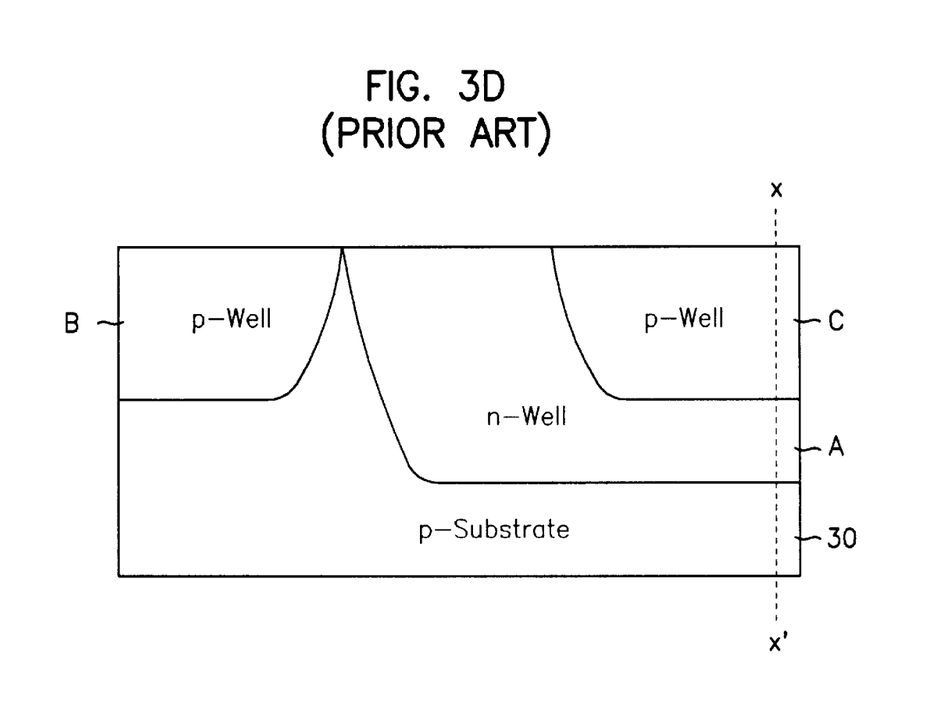

Referring next to FIG. 3D, the triple well, which includes the n-well A, the first p-well B and the second p-well C, is formed in the semiconductor substrate 30 by the thermal treatment performed after the implantation processes.

Figure 4:
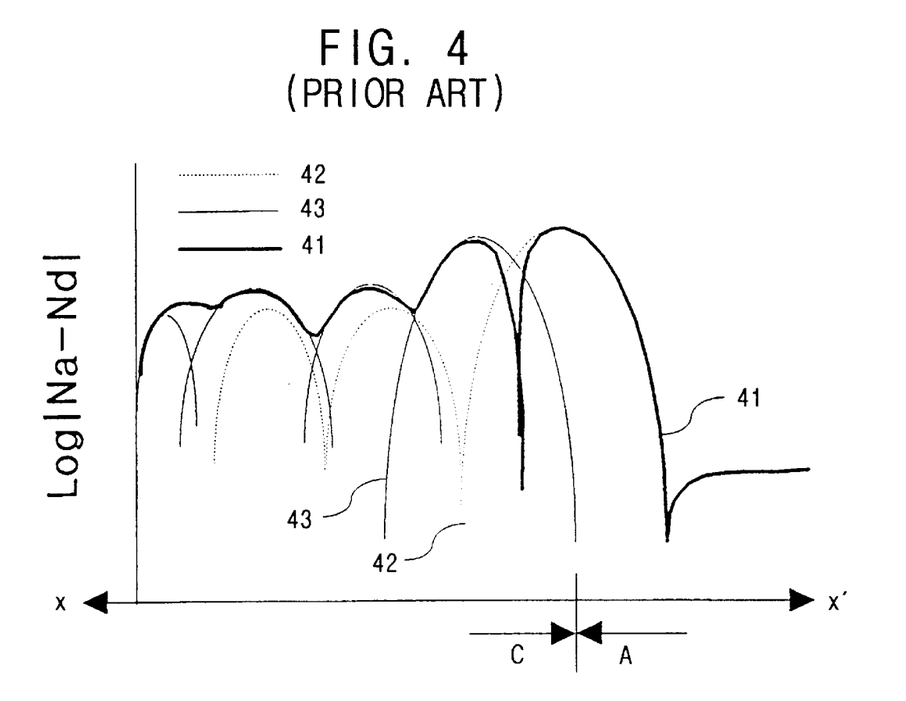
FIG. 4 is a plot showing an ion concentration profile of the region taken along the line X–X' in FIG. 3D.

FIG. 4 is an ion concentration profile 41 of the region taken along the line X–X' in FIG. 3D. The ion concentration profile 42 of the n-type impurities implanted in the process to form the n-well A and the ion concentration profile 43 of p-type impurities implanted in the process to form the second p-well C are also shown in FIG. 4. The longitudinal axis represents the logarithm of the effective concentration. The effective concentration is defined by the difference between the p-type impurities concentration Na and the n-type impurities concentration Nd. The ion concentration profile 41 of the second p-well C is determined by the composition of the ion concentration profiles 42 and 43.

SUMMARY OF THE INVENTION

An object of the present invention is to provide a method for forming a triple well capable of preventing the reduction of the mobility of carriers and reducing the leakage current.

In accordance with an aspect of the present invention, there is a method for fabricating a semiconductor device having a triple well structure, the method comprising the steps of: a) providing a semiconductor substrate; b) implanting first conductivity type impurities into a first region of said semiconductor substrate, wherein said first region is horizontally positioned within said semiconductor substrate; c) implanting first conductivity type impurities into a second region of said semiconductor substrate, wherein said second region is vertically positioned from a surface of said semiconductor substrate to said an end of said first region, so that said first region and said second region form a first well surrounding a third region; d) implanting second conductivity type impurities into said third region so that a second well is surrounded by said first well; e) implanting second conductivity type impurities into said semiconductor substrate adjacent to said first well to form a third well.

In accordance with another aspect of the present invention, there is a method for fabricating a semiconductor device having a triple well structure, the method comprising the steps of: a) providing a semiconductor substrate; b) implanting first conductivity type impurities into a first region of said semiconductor substrate to form a first well; c) implanting first conductivity type impurities into a second region of said semiconductor substrate to form a second well, so that a third region is positioned between said first well and said second well, and wherein said third region is vertically positioned from a surface of said semiconductor substrate to an end of a fourth region which is positioned horizontally below said third region and said first well; d) implanting second conductivity type impurities into said fourth region; and e) implanting second conductivity type impurities into said third region so that said third region and said fourth region form a third well surrounding said first well.

In accordance with a further aspect of the present invention, there is a method for fabricating a semiconductor device having a triple well structure, the method comprising the steps of: providing a semiconductor substrate; implanting first conductivity type impurities into a first region of said semiconductor substrate to form a first well; implanting second conductivity type impurities into a second region of said semiconductor substrate, wherein said second region is adjacent to said first well and positioned from a semiconductor surface to a depth of said first well; implanting second conductivity type impurities into a third region of said semiconductor substrate so that said second region and said third region form a second well surrounding said first well; and implanting first conductivity type impurities into a fourth region of said semiconductor substrate to form a third well, wherein said fourth region is adjacent to said second region.

BRIEF DESCRIPTION OF THE DRAWINGS

These and other objects, features and advantages of the present invention will be more fully apparent from the description of the preferred embodiments with reference to the accompanying drawings, in which.

DETAILED DESCRIPTION OF THE PREFERRED EMBODIMENTS

An embodiment of the present invention will be described in detail below with reference to FIGS. 5A to 5E and 6. In FIGS. 5A to 5E, a method for forming a triple well according to the present invention is shown.

Figure 5A:
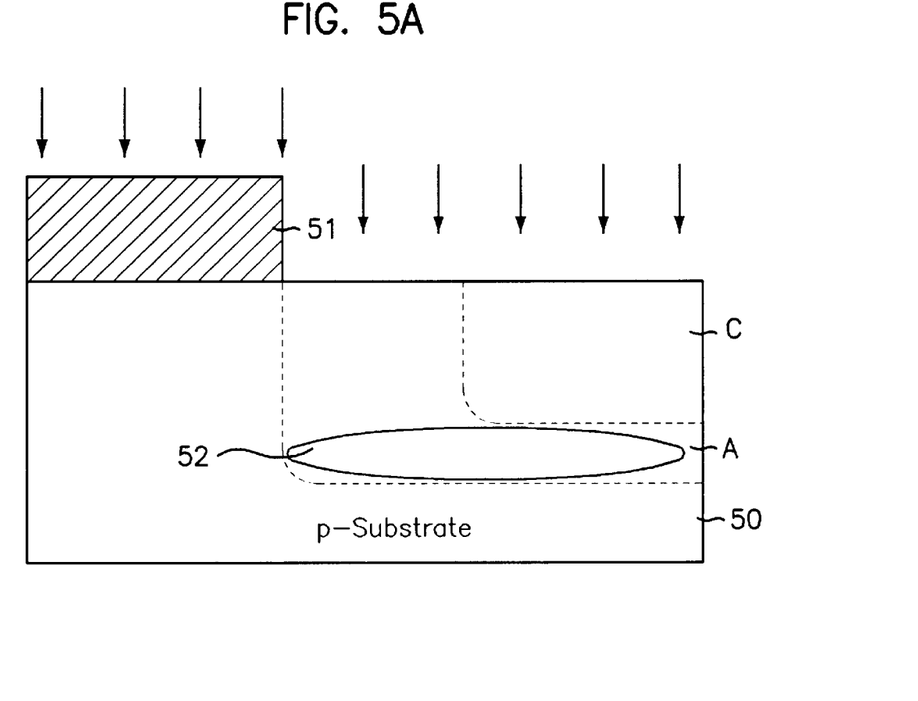
FIGS. 5A to 5E are cross sectional views illustrating a method for forming a triple well of semiconductor device.

First, referring to FIG. 5A, a photoresist pattern 51 is formed on a p-type semiconductor substrate 50. The photoresist pattern 51 exposes two regions, in which an n-well A and a second p-well C are respectively to be formed. The second p-well C is surrounded by the n-well A. After forming the photoresist pattern 51, n-type impurities are deeply implanted into the n-well A to form a first impurities doped region 52.

Figure 5B:
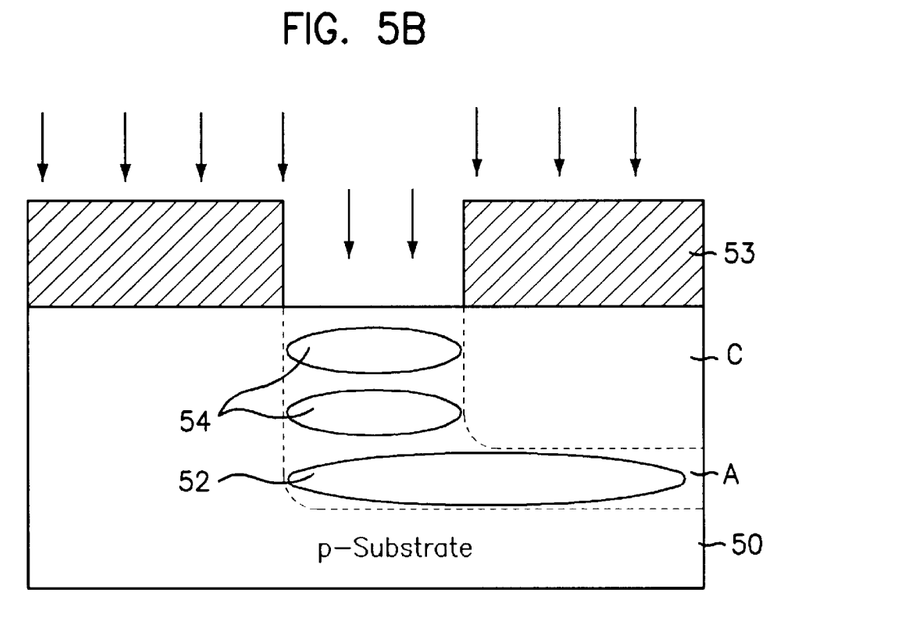

Referring to FIG. 5B, the photoresist pattern 51 is removed and a photoresist pattern 53 is formed. The photoresist pattern 53 is formed, exposing the upper surface of the n-well A. After forming the photoresist pattern 53, N-type impurities are implanted into the region exposed by the photoresist pattern 53, to form a second impurities doped regions 54 in the n-well. The implantation processes are carried out by three or four times with different energy.

In the implantation process to form the n-well A, none of the n-type impurities are implanted in the second p-well C. Therefore, it is easy to design the doping profile of the second p-well C surrounded by the n-well A.

Figure 5C:
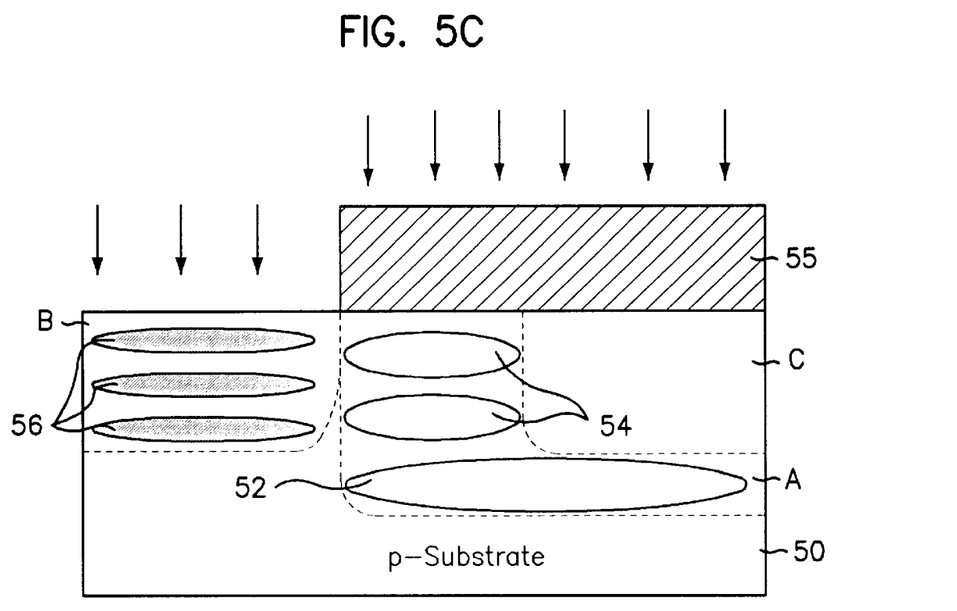

Referring next to FIG. 5C, the photoresist pattern 53 is removed and a photoresist pattern 55 is formed. The photoresist pattern 55 exposes a region in which a first p-well B is to be formed. The first p-well B is apart, by a predetermined distance, from the second p-well C and is adjacent to the n-well A. After forming the photoresist pattern 55, the implantation processes are carried out by three or four times with different energy to form the p-type impurities doped regions 56.

Figure 5D:
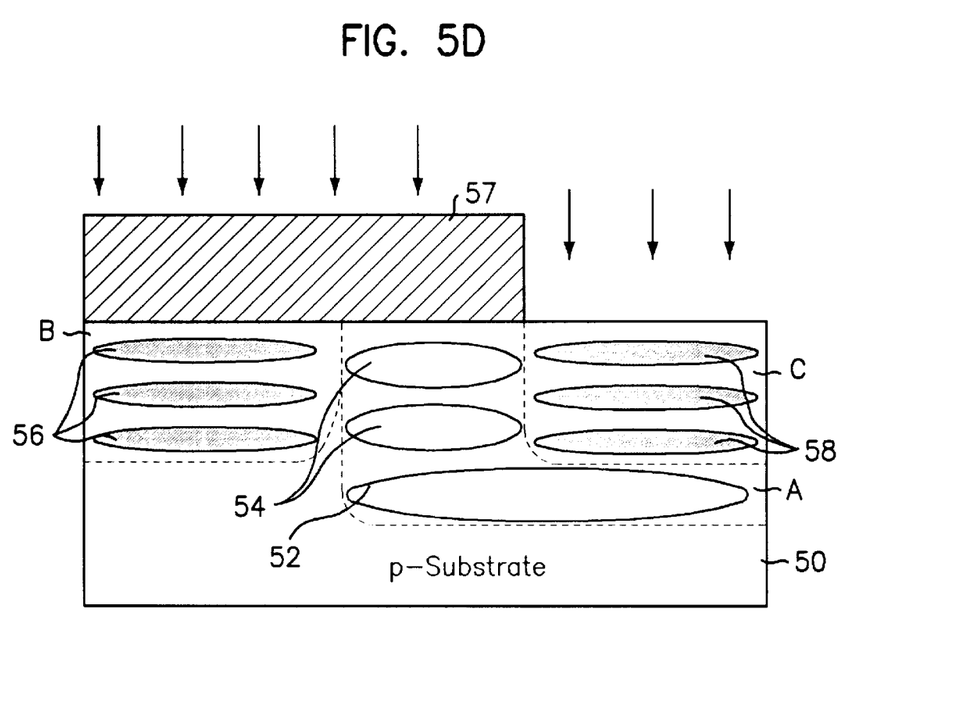

Referring next to FIG. 5D, the photoresist pattern 55 is removed and a photoresist pattern 57 is formed. The photoresist pattern 57 exposes a region, in which the second p-well C is to be formed. The second p-well C is surrounded by the n-well A. After forming the photoresist pattern 57, the implantation processes are carried out by three or four times with different energy to form the p-type impurities doped regions 58. In the second p-well C, only p-type impurities are implanted, which is different from the conventional method. Accordingly, it is possible to prevent the reduction of the mobility of carriers and reduces the leakage current.

Figure 5E:
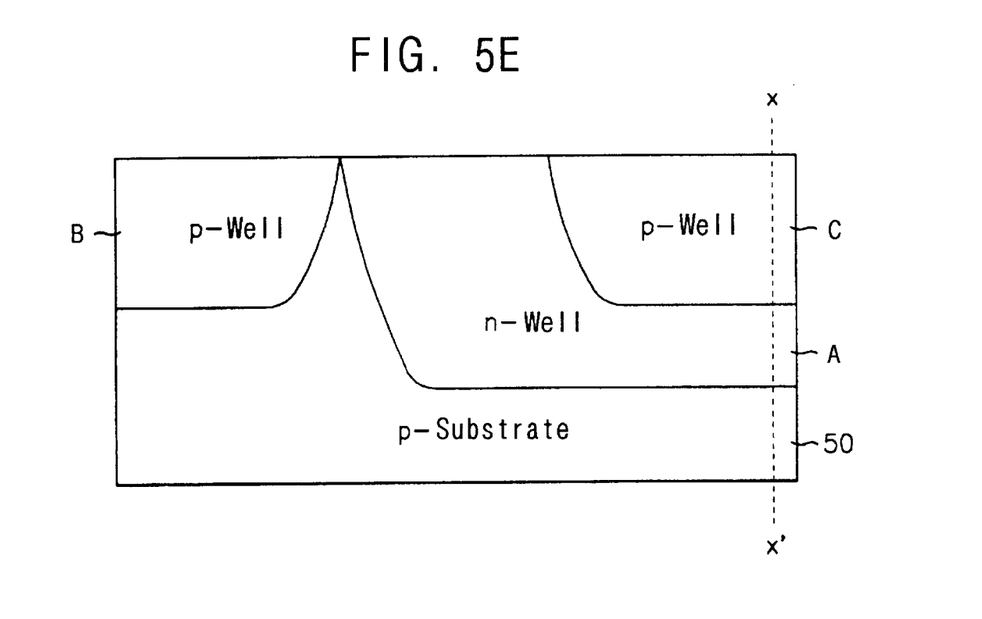

Referring next to FIG. 5E, the triple well, including the n-well A, the first p-well B and the second p-well C, is formed in the semiconductor substrate 50 by the thermal treatment performed after the implantation processes.

Figure 6:
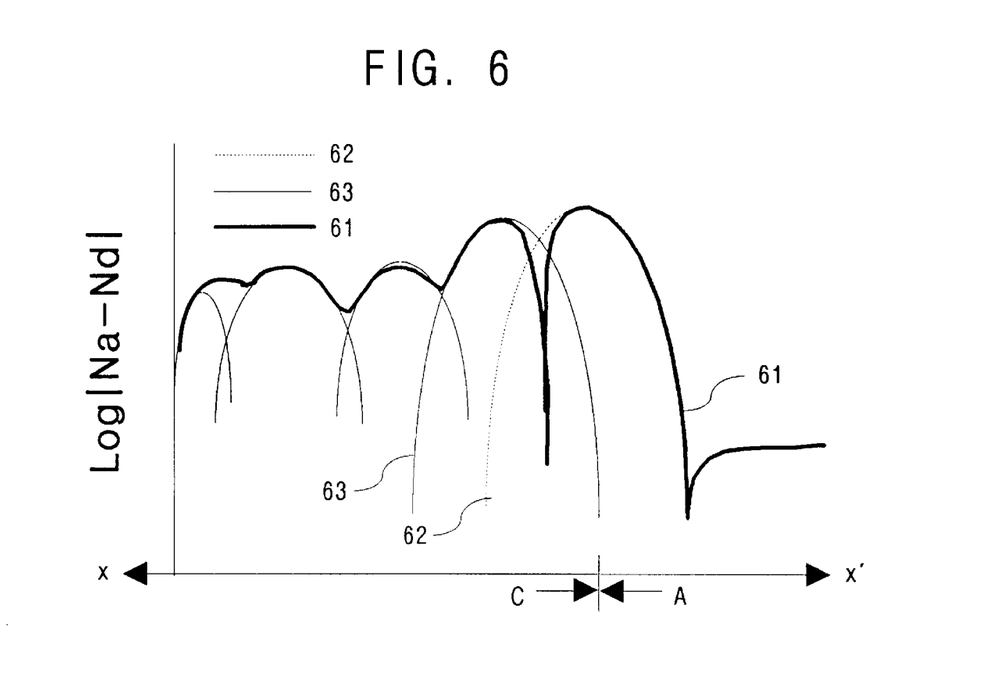
FIG. 6 is a plot showing an ion concentration profile of the region taken along the line X–X' in FIG. 5E.

FIG. 6 shows an ion concentration profile 61 of the region taken along the line X–X' in FIG. 5E. The ion concentration profile 62 of the n-type impurities implanted in the process to form the n-well A and the ion concentration profile 63 of p-type impurities implanted in the process to form the second p-well C are also shown in FIG.6. The longitudinal axis represents the logarithm of the effective concentration. The effective concentration is defined by the difference between the p-type impurities concentration Na and n-type impurities concentration Nd. The ion concentration profile 61 in the second p-well C region is determined only by the implantation process for forming the second p-well C.

Another method for forming a triple well will be described below. According to another method of the present invention, three or four times of the implantation processes are carried out with different energy, to form a first p-well surrounded by an n-well. Thereafter, three or four times of implantation processes are carried out with different energy to form a second p-well which is apart, by a predetermined distance, from the first p-well and is adjacent to the n-well. Thereafter, n-type impurities are deeply implanted into the n-well to form a first impurities doped region of the n-well and the implantation processes are carried out by three or four times with different energy to form a second impurities doped regions of the n-well.

According to further embodiment of the present invention, a first and a second p-well are simultaneously formed. That is to say, n-type impurities are implanted only into a portion of an n-well, thereafter, p-type impurities are simultaneously implanted into the first and the second p-well. Otherwise, p-type impurities are simultaneously implanted into the first and the second p-well, thereafter, n-type impurities are implanted only into the n-well. The first p-well is surrounded by the n-well and the second p-well is apart, by a predetermined distance, from the first p-well and is adjacent to the n-well.

In the above-mentioned embodiments, impurities deeply implanted in said deepest part of the n-well are phosphor. The dose of implanted phosphor is in the range of $3E13/cm^2$ to $5E13/cm^2$ and it is implanted at an energy level in the range of 1.6 MeV to 2 MeV.

Although the preferred embodiments of the present invention have been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a semiconductor device having a triple well structure, the method comprising the steps of:
   a) providing a semiconductor substrate;
   b) implanting first conductivity type impurities into a first region of said semiconductor substrate to form a first well;
   c) implanting first conductivity type impurities into a second region of said semiconductor substrate to form a second well, so that a third region is positioned between said first well and said second well, wherein said third region is vertically positioned from a surface of said semiconductor substrate to an end of a fourth region which is positioned horizontally below said third region and said first well;
   d) implanting second conductivity type impurities into said fourth region; and
   e) implanting second conductivity type impurities into said third region so that said third region and said fourth region form a third well surrounding said first well.

2. The method for fabricating semiconductor device according to claim 1, wherein said step b) and c) are simultaneously performed.

3. The method for fabricating semiconductor device according to claim 1, wherein said first conductivity type impurities implanted into said first region are phosphor, wherein the dose of said phosphor is in the range of $3E13/cm^2$ to $5E13/cm^2$.

4. The method for fabricating semiconductor device according to claim 3, wherein said phosphor is implanted at an energy level in the range of 1.6 MeV to 2 MeV.

5. A method for fabricating a semiconductor device having a triple well structure, the method comprising the steps of:
   providing a semiconductor substrate;
   implanting first conductivity type impurities into a first region of said semiconductor substrate to form a first well;
   implanting second conductivity type impurities into a second region of said semiconductor substrate, wherein said second region is adjacent to said first well and positioned from a semiconductor surface to a depth of said first well;
   implanting second conductivity type impurities into a third region of said semiconductor substrate so that said second region and said third region form a second well surrounding said first well; and
   implanting first conductivity type impurities into a fourth region of said semiconductor substrate to form a third well, wherein said fourth region is adjacent to said second region.

* * * * *